US008784565B2

(12) United States Patent
Hillabrand et al.

(10) Patent No.: US 8,784,565 B2
(45) Date of Patent: *Jul. 22, 2014

(54) MANUFACTURING APPARATUS FOR DEPOSITING A MATERIAL AND AN ELECTRODE FOR USE THEREIN

(75) Inventors: David Hillabrand, Midland, MI (US); Theodore Knapp, Midland, MI (US)

(73) Assignee: Hemlock Semiconductor Corporation, Hemlock, MI (US)

( * ) Notice: Subject to any disclaimer, the term of this patent is extended or adjusted under 35 U.S.C. 154(b) by 652 days.

This patent is subject to a terminal disclaimer.

(21) Appl. No.: 12/937,927

(22) PCT Filed: Apr. 13, 2009

(86) PCT No.: PCT/US2009/002293
§ 371 (c)(1),
(2), (4) Date: Oct. 14, 2010

(87) PCT Pub. No.: WO2009/128887
PCT Pub. Date: Oct. 22, 2009

(65) Prior Publication Data
US 2011/0031115 A1  Feb. 10, 2011

Related U.S. Application Data

(60) Provisional application No. 61/044,703, filed on Apr. 14, 2008.

(51) Int. Cl.
| C23C 16/50 | (2006.01) |
| C23C 16/00 | (2006.01) |
| C23F 1/00 | (2006.01) |
| H01L 21/306 | (2006.01) |
| C23C 16/44 | (2006.01) |
| H05B 3/03 | (2006.01) |

(52) U.S. Cl.
CPC ............. *C23C 16/4418* (2013.01); *H05B 3/03* (2013.01)
USPC ......................................................... 118/728

(58) Field of Classification Search
CPC .................................................... C01B 33/035
USPC ......... 118/715, 728–733; 156/345.51–345.55
See application file for complete search history.

(56) References Cited

U.S. PATENT DOCUMENTS

| 2,999,735 | A | 9/1961 | Reuschel |
| 3,011,877 | A | 12/1961 | Schweickert et al. |
| 3,057,690 | A | 10/1962 | Reuschel et al. |
| 3,058,812 | A | 10/1962 | Chu et al. |
| 3,147,141 | A | 9/1964 | Ishizuka |
| 3,152,933 | A | 10/1964 | Reuschel |
| 3,330,251 | A | 7/1967 | Gutsche |
| 3,918,396 | A | 11/1975 | Dietze et al. |
| 4,141,764 | A | 2/1979 | Authier et al. |
| 4,147,814 | A | 4/1979 | Yatsurugi et al. |
| 4,150,168 | A | 4/1979 | Yatsurugi et al. |
| 4,173,944 | A | 11/1979 | Koppl et al. |
| 4,179,530 | A | 12/1979 | Koppl et al. |
| 4,304,641 | A | 12/1981 | Grandia et al. |
| 4,311,545 | A | 1/1982 | Bugl et al. |
| 4,466,864 | A | 8/1984 | Bacon et al. |
| 4,477,911 | A | 10/1984 | Racki |
| 4,481,232 | A | 11/1984 | Olson |
| 4,707,225 | A | 11/1987 | Schuler et al. |
| 4,766,349 | A * | 8/1988 | Johansson et al. ............ 313/631 |
| 4,805,556 | A | 2/1989 | Hagan et al. |
| 4,822,641 | A | 4/1989 | Weik |
| 5,096,550 | A | 3/1992 | Mayer et al. |
| 5,227,041 | A | 7/1993 | Brogden et al. |
| 5,422,088 | A | 6/1995 | Burgie et al. |
| 5,438,175 | A | 8/1995 | Herklotz et al. |
| 5,447,615 | A | 9/1995 | Ishida |
| 5,567,300 | A | 10/1996 | Datta et al. |
| 5,593,465 | A | 1/1997 | Seifert et al. |
| 5,807,165 | A | 9/1998 | Uzoh et al. |
| 5,906,799 | A | 5/1999 | Burgie et al. |
| 5,911,619 | A | 6/1999 | Uzoh et al. |
| 6,004,880 | A | 12/1999 | Liu et al. |
| 6,176,992 | B1 | 1/2001 | Talich |
| 6,221,155 | B1 | 4/2001 | Keck et al. |
| 6,225,602 | B1 | 5/2001 | Buijze et al. |
| 6,284,312 | B1 | 9/2001 | Chandra et al. |
| 6,639,192 | B2 | 10/2003 | Hertlein et al. |

| | | | |
|---|---|---|---|
| 7,045,045 B2 * | 5/2006 | Natsuhara et al. ....... 204/297.06 |
| 2002/0024277 A1 | 2/2002 | Fuchs et al. |
| 2002/0106944 A1 | 8/2002 | Miyanoo et al. |
| 2003/0021894 A1 | 1/2003 | Inoue et al. |
| 2007/0251455 A1 | 11/2007 | Wan et al. |

FOREIGN PATENT DOCUMENTS

| | | |
|---|---|---|
| DE | 1264400 B | 3/1968 |
| FR | 2741227 A1 | 5/1997 |
| GB | 1054141 A | 1/1967 |
| JP | 2001077097 A | 3/2001 |
| JP | 2004-205059 A | 7/2004 |
| JP | 2005272965 A | 10/2005 |
| JP | 2006016243 A | 1/2006 |
| JP | 2007281161 A | 10/2007 |
| RU | 2135629 C1 | 8/1999 |
| WO | WO 01-60121 A1 | 8/2001 |
| WO | WO 03-107720 A1 | 12/2003 |
| WO | 2009128886 A1 | 10/2009 |
| WO | WO 2009-128886 A1 | 10/2009 |
| WO | WO 2009-128888 A1 | 10/2009 |

OTHER PUBLICATIONS

Germany Patent No. DE 1264400 extracted from espacenet.com database Mar. 29, 2011, no English translation available 4 pages.
English language abstract for FR 2741227 extracted from espacenet.com database Mar. 29, 2011, 13 pages.
English language translational and abstract for JP 2004-205059 extracted from PAJ database Mar. 29, 2011, 21 pages.
English language abstract for WO 01-60121 extracted from espacenet.com database dated Mar. 29, 2011, 16 pages.
PCT International Search Report for PCT/US2009/002293, dated Jul. 14, 2009, 3 pages.
PCT International Search Report for PCT/US2009/002294, dated Jul. 10, 2009, 3 pages.
PCT International Search Report for PCT/US2009/002289, dated Jul. 7, 2009, 4 pages.
Publication: Maex et al. "Properties of Metal Silicides", INSPEC, 1995, Chapter 7, 32 pages.
English language abstract for RU 2135629 extracted from the espacenet.com database on May 21, 2013, 2 pages.
Japanese Patent No. 2001077097 A; Date of Publication: Mar. 23, 2001; Abstract Only, 2 pages.
Japanese Patent No. 2005272965 A; Date of Publication: Oct. 6, 2005; Abstract Only, 2 pages.
Japanese Patent No. 2006016243 A; Date of Publication: Jan. 19, 2006; Abstract Only, 2 pages.
Japanese Patent No. 2007281161 A; Date of Publication: Oct. 25, 2007; Abstract Only, 1 page.

\* cited by examiner

*Primary Examiner* — Maureen Gramaglia
*Assistant Examiner* — Tiffany Nuckols
(74) *Attorney, Agent, or Firm* — Cantor Colburn LLP

(57) ABSTRACT

The present invention relates to a manufacturing apparatus for deposition of a material on a carrier body and an electrode for use with the manufacturing apparatus. Typically, the carrier body has a first end and a second end spaced from each other. A socket is disposed at each of the end of the carrier body. The manufacturing apparatus includes a housing that defines a chamber. At least one electrode is disposed through the housing with the electrode at least partially disposed within the chamber for coupling to the socket. The electrode has an exterior surface having a contact region that is adapted to contact the socket. A contact region coating is disposed on the contact region of the exterior surface of the electrode. The contact region coating has an electrical conductivity of at least $9 \times 10^6$ Siemens/meter and a corrosion resistance that is higher than silver in a galvanic series that is based upon room temperature sea water as an electrolyte.

21 Claims, 6 Drawing Sheets

FIG - 2A
FIG - 2B
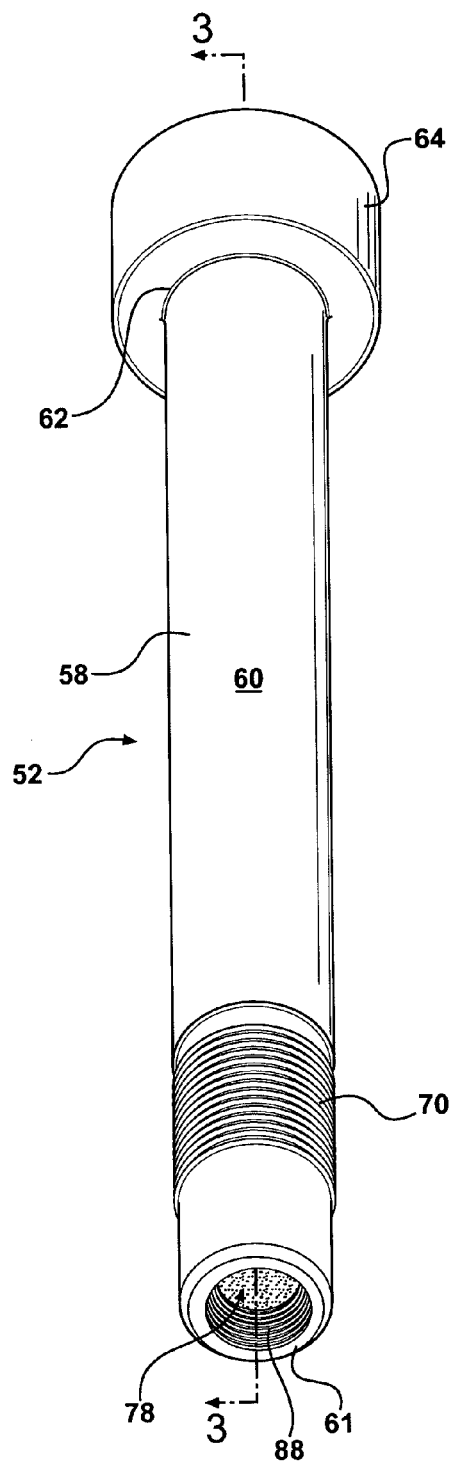
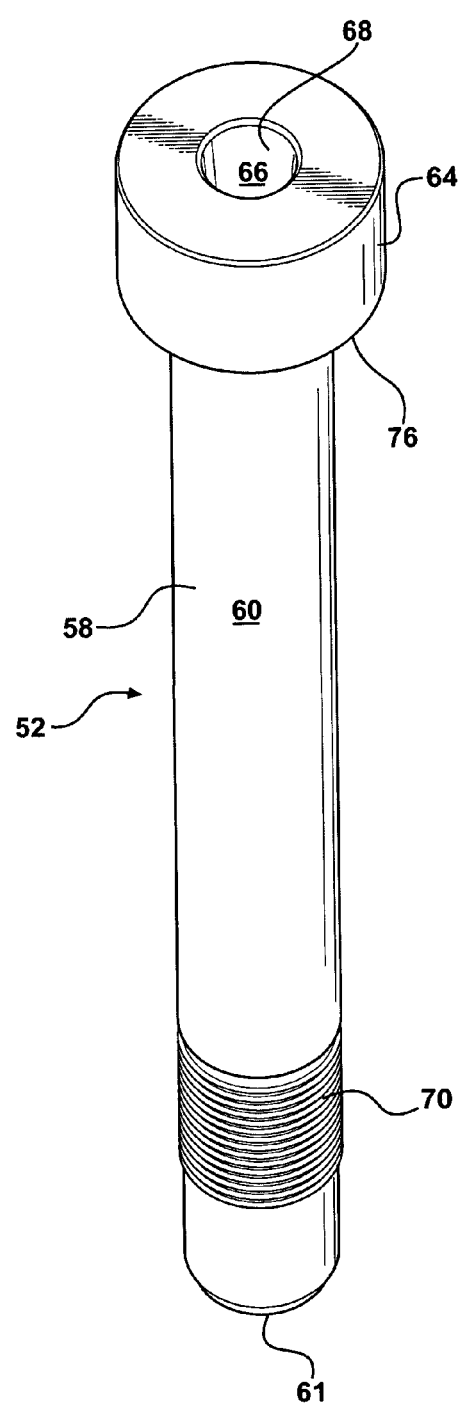

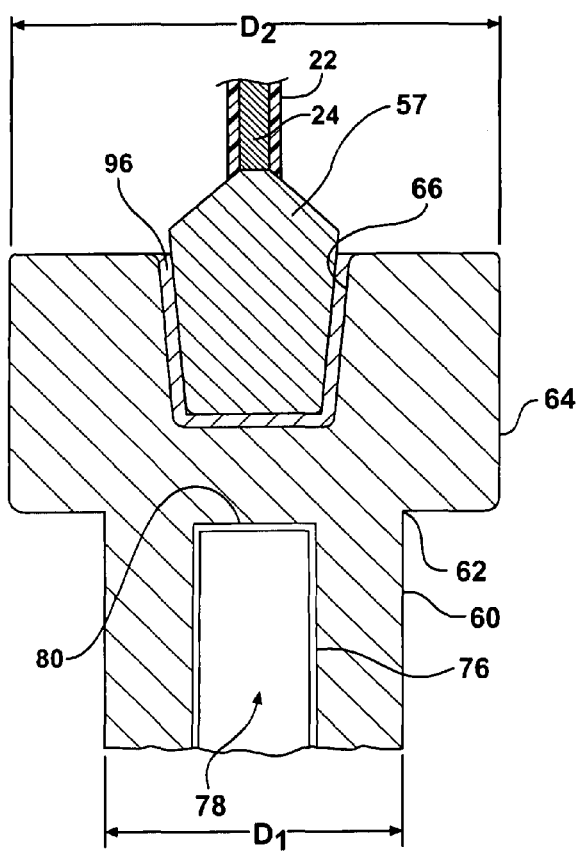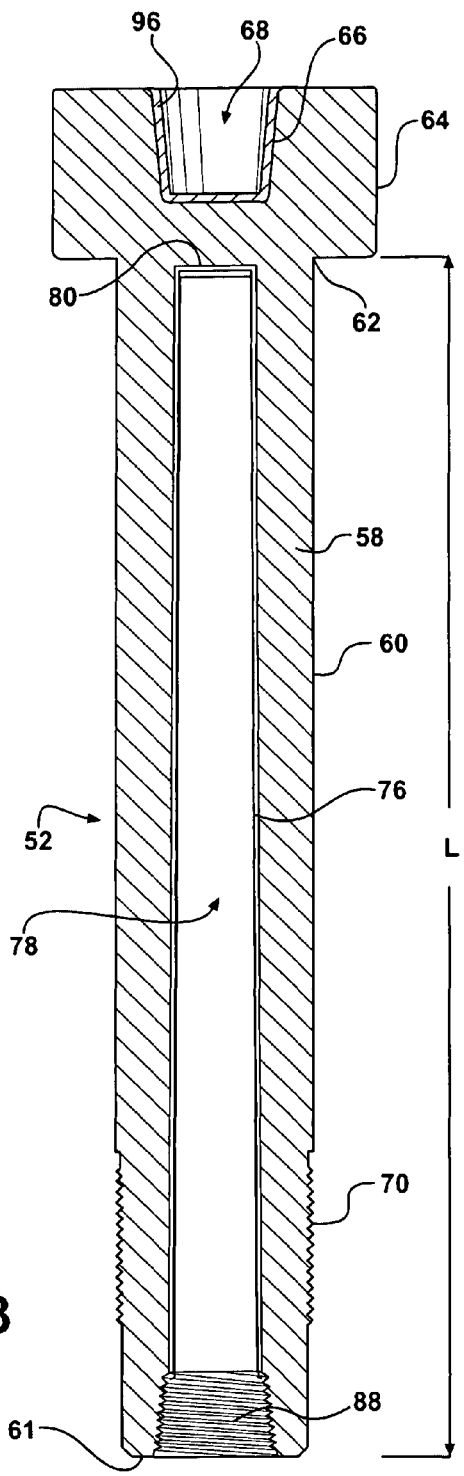

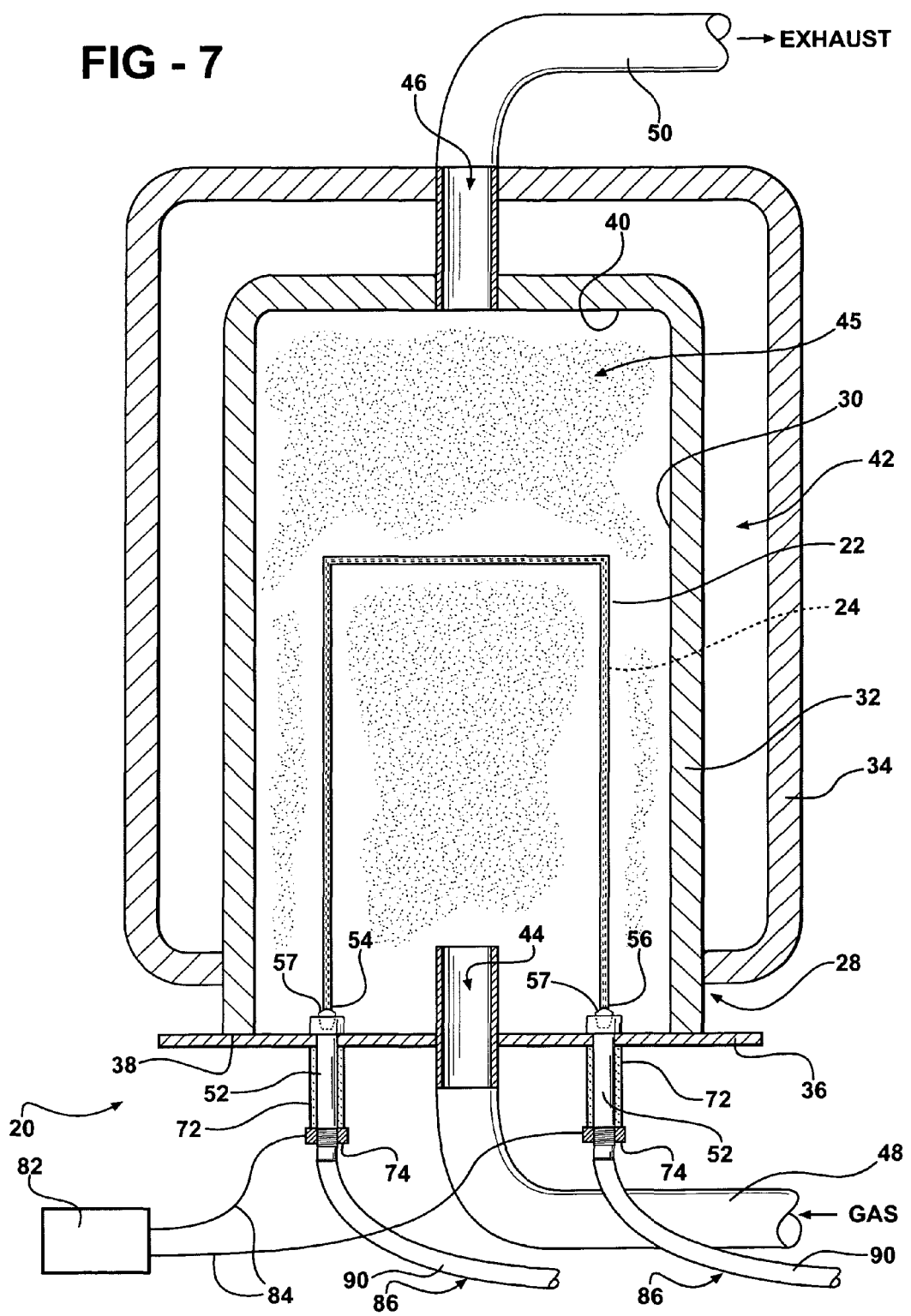

MANUFACTURING APPARATUS FOR DEPOSITING A MATERIAL AND AN ELECTRODE FOR USE THEREIN

RELATED APPLICATIONS

This application claims priority to and all advantages of PCT International Patent Application No. PCT/US09/02293, filed on Apr. 13, 2009, and U.S. Provisional Patent Application No. 61/044703, which was filed on Apr. 14, 2008.

FIELD OF THE INVENTION

The present invention relates to a manufacturing apparatus. More specifically, the present invention relates to an electrode utilized within the manufacturing apparatus.

BACKGROUND OF THE INVENTION

Manufacturing apparatuses for the deposition of a material on a carrier body are known in the art. Such manufacturing apparatuses comprise a housing that defines a chamber. Generally, the carrier body is substantially U-shaped having a first end and a second end spaced from each other. Typically, a socket is disposed at each end of the carrier body. Generally, two or more electrodes are disposed within the chamber for receiving the respective socket disposed at the first end and the second end of the carrier body. The electrode also includes a contact region, which supports the socket and, ultimately, the carrier body to prevent the carrier body from moving relative to the housing. The contact region is the portion of the electrode adapted to be in direct contact with the socket and that provides a primary current path from the electrode to the socket and into the carrier body.

A power supply device is coupled to the electrode for supplying an electrical current to the carrier body. The electrical current heats both the electrode and the carrier body. The electrode and the carrier body each have a temperature with the temperature of the carrier body being heated to a deposition temperature. A processed carrier body is formed by depositing the material on the carrier body.

As known in the art, variations exist in the shape of the electrode and the socket to account for thermal expansion of the material deposited on the carrier body as the carrier body is heated to the deposition temperature. One such method utilizes a flat head electrode and a socket in the form of a graphite sliding block. The graphite sliding block acts as a bridge between the carrier body and the flat head electrode. The weight of the carrier body and the graphite sliding block acting on the contact region reduces the contact resistance between the graphite sliding block and the flat head electrode. Another such method involves the use of a two-part electrode. The two-part electrode includes a first half and a second half for compressing the socket. A spring element is coupled to the first half and the second half of the two-part electrode for providing a force to compress the socket. Another such method involves the use of an electrode defining a cup with the contact region located within the cup of the electrode. The socket is adapted to fit into the cup of the electrode and to contact the contact region located within the cup of the electrode. Alternatively, the electrode may define the contact region on an outer surface thereof without defining a cup, and the socket may be structured as a cap that fits over the top of the electrode for contacting the contact region located on the outer surface of the electrode.

A fouling of the electrode occurs on the contact region due to the buildup of deposits. The deposits result in an improper fit between the socket and the electrode over time. The improper fit causes small electrical arcs between the contact region and the socket that result in metal contamination of the material deposited on the carrier body. The metal contamination reduces the value of the carrier body as the material deposited is less pure. Additionally, the fouling reduces the heat transfer between the electrode and the socket resulting in the electrode reaching higher temperatures to effectively heat the socket and ultimately the carrier body. The higher temperatures of the electrode result in accelerated deposition of the material on the electrode. This is especially the case for electrodes that comprise silver or copper as the sole or main metal present therein.

The electrode must be replaced when one or more of the following conditions occur: first, when the metal contamination of the material being deposited upon the carrier body exceeds a threshold level; second, when fouling of the contact region of the electrode causes the connection between the electrode and the socket to become poor; third, when excessive operating temperatures for the electrode are required due to fouling of the contact region of the electrode. The electrode has a life determined by the number of the carrier bodies the electrode can process before one of the above occurs.

In view of the foregoing problems related to fouling of the electrode, there remains a need to at least delay the fouling of the electrode for maintaining the connection between the electrode and the socket to improve the productivity and increase the life of the electrode.

SUMMARY OF THE INVENTION AND ADVANTAGES

The present invention relates to a manufacturing apparatus for deposition of a material on a carrier body and an electrode for use with the manufacturing apparatus. The carrier body has a first end and a second end spaced from each other. A socket is disposed at each of the ends of the carrier body.

The manufacturing apparatus includes a housing that defines a chamber. The housing also defines an inlet for introducing a gas into the chamber and an outlet for exhausting the gas from the chamber. At least one electrode is disposed through the housing with the electrode at least partially disposed within the chamber for coupling to the socket. The electrode has an exterior surface having a contact region that is adapted to contact the socket. A contact region coating is disposed on the contact region of the exterior surface of the electrode. The contact region coating has an electrical conductivity of at least $9 \times 10^6$ Siemens/meter and a corrosion resistance that is higher than silver in a galvanic series that is based upon room temperature sea water as an electrolyte. A power supply device is coupled to the electrode for providing an electrical current to the electrode.

There are many advantages to controlling the type and location of the contact region coating on the exterior surface of the electrode. One advantage is that it is possible to delay fouling of the electrode by tailoring the contact region coating on the exterior surface of the electrode with different materials based on the source of fouling. By delaying fouling, the life of the electrode is extended, resulting in a lower production cost and reducing the production time of the processed carrier bodies. Further, considerations with regard to electrical conductivity are of greater importance within the contact region on the exterior surface as compared to outside the contact region, thereby providing advantages to using materials that satisfy the corrosion and electrical conductivity in the contact region coating.

BRIEF DESCRIPTION OF THE DRAWINGS

Other advantages of the present invention will be readily appreciated, as the same becomes better understood by reference to the following detailed description when considered in connection with the accompanying drawings wherein:

FIG. 2A is a first perspective view of an electrode utilized with the manufacturing apparatus of FIG. 1 showing an interior surface;

FIG. 2B is a second perspective view of the electrode of FIG. 2A defining a cup with a contact surface located within a portion of the cup;

FIG. 3 is a cross-sectional view of the electrode of FIG. 2 taken along line 3-3;

FIG. 4 is an enlarged cross-sectional view of a portion of the electrode of FIG. 3 showing a socket disposed within the cup;

FIG. 7 is a cross-sectional view of the manufacturing apparatus of FIG. 1 during the deposition of the material on the carrier body.

DETAILED DESCRIPTION OF THE INVENTION

Figure 1:
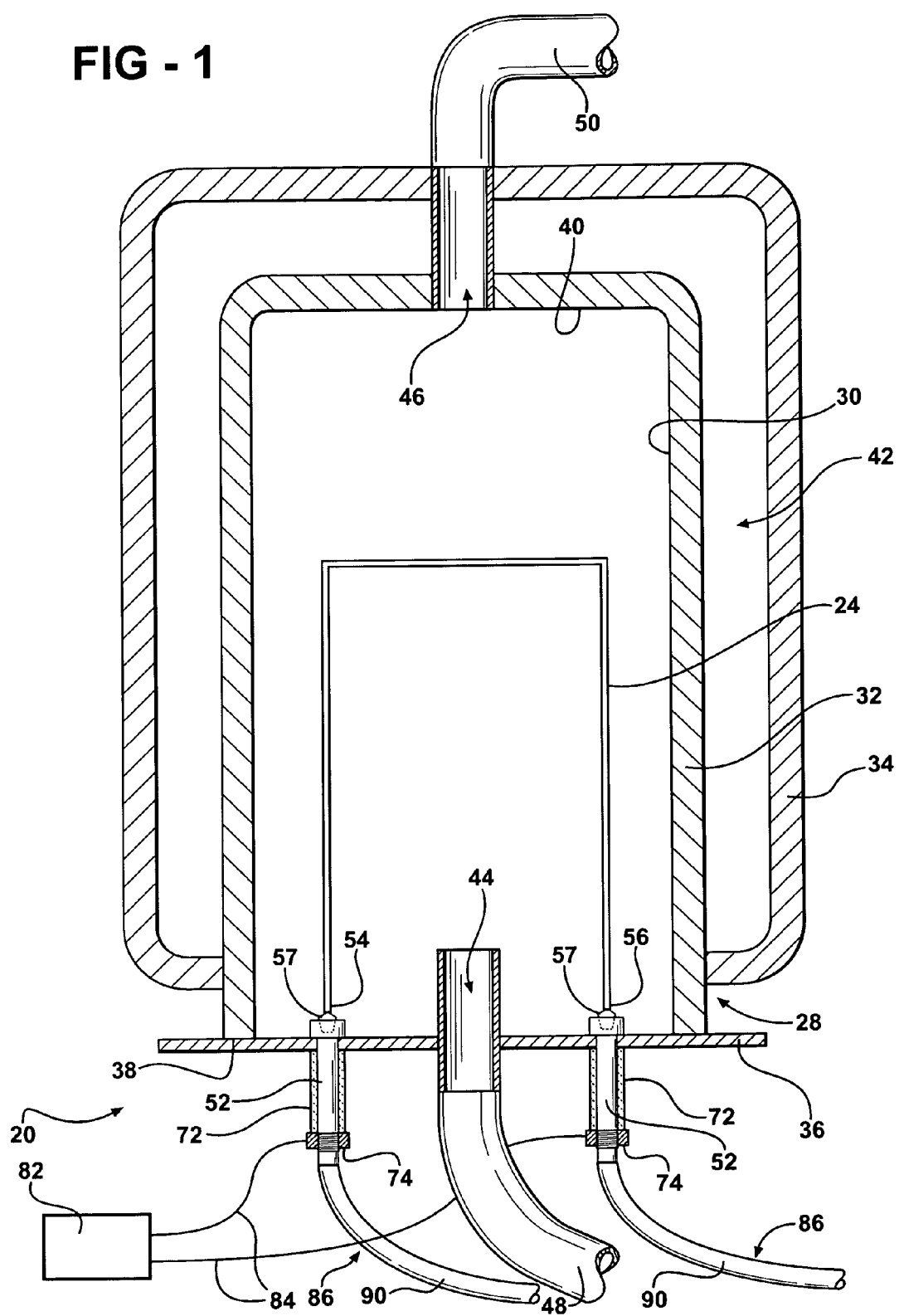
FIG. 1 is a cross-sectional view of a manufacturing apparatus for depositing a material on a carrier body including an electrode.
Figure 6:
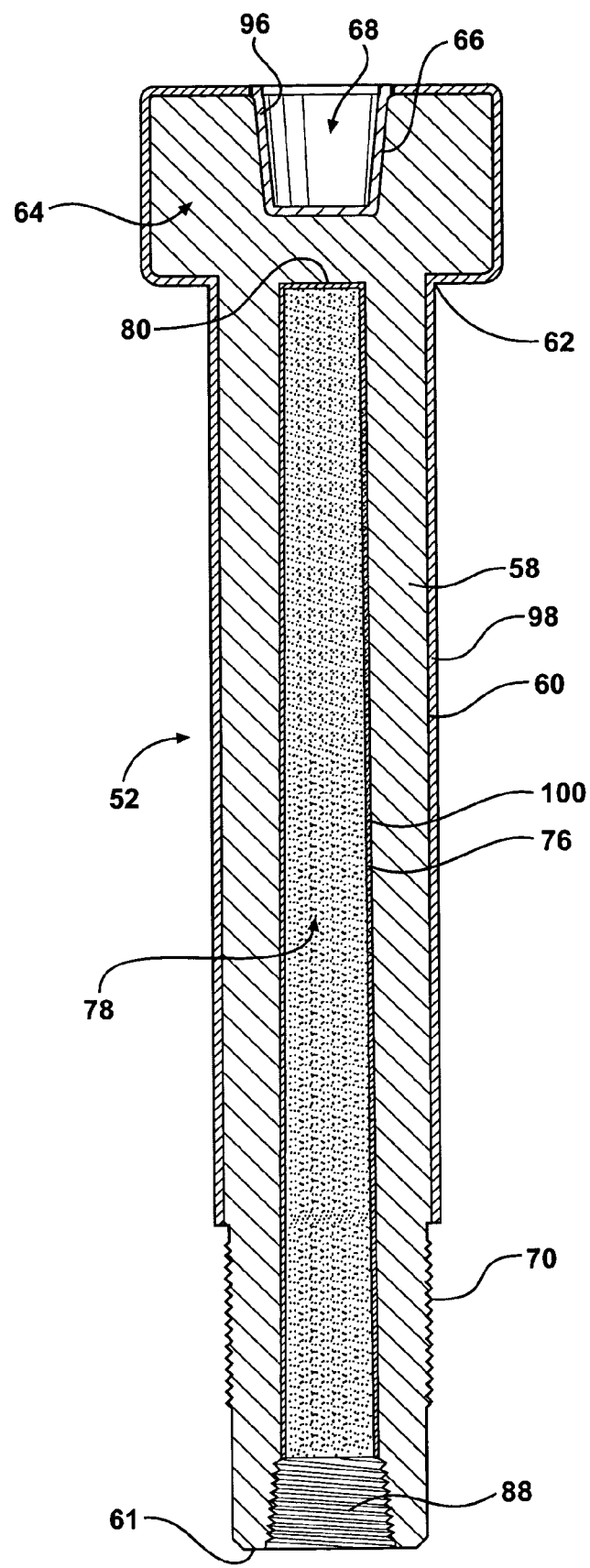
FIG. 6 is a cross-sectional view of another embodiment of the electrode of FIGS. 2 through 5 with a contact region coating, an exterior coating and a channel coating disposed on the electrode.

Referring to the Figures, wherein like numerals indicate like or corresponding parts throughout the several views, a manufacturing apparatus 20 for deposition of a material 22 on a carrier body 24 is shown in FIGS. 1 and 6. In one embodiment, the material 22 to be deposited is silicon; however, it is to be appreciated that the manufacturing apparatus 20 can be used to deposit other materials on the carrier body 24 without deviating from the scope of the subject invention.

Typically, with methods of chemical vapor deposition known in the art such as the Siemens method, the carrier body 24 is substantially U-shaped and has a first end 54 and a second end 56 spaced and parallel to each other. A socket 57 is disposed at each of the first end 54 and the second end 56 of the carrier body 24.

The manufacturing apparatus 20 includes a housing 28 that defines a chamber 30. Typically, the housing 28 comprises an interior cylinder 32, an outer cylinder 34 and a base plate 36. The interior cylinder 32 includes an open end 38 and a closed end 40 spaced from each other. The outer cylinder 34 is disposed about the interior cylinder 32 to define a void 42 between the interior cylinder 32 and the outer cylinder 34, typically serving as a jacket to house a circulated cooling fluid (not shown). It is to be appreciated by those skilled in the art that the void 42 can be, but is not limited to, a conventional vessel jacket, a baffled jacket, or a half-pipe jacket.

The base plate 36 is disposed on the open end 38 of the interior cylinder 32 to define the chamber 30. The base plate 36 includes a seal (not shown) disposed in alignment with the interior cylinder 32 for sealing the chamber 30 once the interior cylinder 32 is disposed on the base plate 36. In one embodiment, the manufacturing apparatus 20 is a Siemens type chemical vapor deposition reactor.

The housing 28 defines an inlet 44 for introducing a gas 45 into the chamber 30 and an outlet 46 for exhausting the gas 45 from the chamber 30. Typically, an inlet pipe 48 is connected to the inlet 44 for delivering the gas 45 to the housing 28 and an exhaust pipe 50 is connected to the outlet 46 for removing the gas 45 from the housing 28. The exhaust pipe 50 can be jacketed with a cooling fluid such as water or a commercial heat transfer fluid.

At least one electrode 52 is disposed through the housing 28 for coupling with the socket 57. In one embodiment, as shown in FIGS. 1 and 6, the at least one electrode 52 includes a first electrode 52 disposed through the housing 28 for receiving the socket 57 of the first end 54 of the carrier body 24 and a second electrode 52 disposed through the housing 28 for receiving the socket 57 of the second end 56 of the carrier body 24. It is to be appreciated that the electrode 52 can be any type of electrode known in the art such as, for example, a flat head electrode, a two-part electrode or a cup electrode. Further, the at least one electrode 52 is at least partially disposed within the chamber 30. In one embodiment, the electrode 52 is disposed through the base plate 36.

The electrode 52 comprises an electrically conductive material having a minimum electrical conductivity at room temperature of at least $14 \times 10^6$ Siemens/meter or S/m. For example, the electrode 52 can comprise at least one of copper, silver, nickel, Inconel and gold, each of which meets the conductivity parameters set forth above. Additionally, the electrode 52 can comprise an alloy that meets the conductivity parameters set forth above. Typically, the electrode 52 comprises electrically conductive material having a minimum electrical conductivity at room temperature of about $58 \times 10^6$ S/m. Typically, the electrode 52 comprises copper and the copper is typically present in an amount of about 100% by weight based on the weight of the electrode 52. The copper can be oxygen-free electrolytic copper grade UNS 10100.

Referring also to FIGS. 2A, 2B and 3, the electrode 52 has an exterior surface 60. The exterior surface 60 of the electrode 52 has a contact region 66. In particular, the contact region 66 as defined herein is the portion of the exterior surface 60 of the electrode 52 that is adapted to be in direct contact with the socket 57 and that provides a primary current path from the electrode 52 through the socket 57 and into the carrier body 24. As such, during normal operation of the manufacturing apparatus 20, the contact region 66 is shielded from exposure to the material 22 that is deposited on the carrier body 24. Because the contact region 66 is adapted to be in direct contact with the socket 57 and is generally not exposed to the material 22 during deposition on the carrier body 24, the contact region 66 is subject to different design considerations than other portions of the electrode 52, which considerations are described in further detail below.

In one embodiment the electrode 52 includes a shaft 58 having a first end 61 and a second end 62. When present, the shaft 58 further defines the exterior surface 60 of the electrode 52. Generally, the first end 61 is an open end of the electrode 52. In one embodiment, the shaft 58 has a circular cross sectional shape resulting in a cylindrically shaped shaft and defines a diameter $D_1$. However, it is to be appreciated that the shaft 58 can have a rectangular, a triangular, or an elliptical cross sectional shape without deviating from the subject invention.

The electrode 52 can also include a head 64 disposed on one of the ends 61, 62 of the shaft 58. It is to be appreciated that the head 64 can be integral to the shaft 58. Typically, when the head 64 is present, the contact region 66 is located on the head 64. It is to be appreciated by those skilled in the art that the method of connecting the socket 57 to the electrode 52 can vary between applications without deviating from the subject invention. For example, in one embodiment, such as for flat head electrodes (not shown), the contact region can merely be a top, flat surface on the head 64 of the electrode 52 and the socket 57 can define a socket cup (not shown) that fits over the head 64 of the electrode 52 for contacting the contact region. Alternatively, although not shown, the head 64 may be absent from the ends 61,62 of the shaft 58. In this embodiment, the electrode 52 may define the contact region on the exterior surface 60 of the shaft 58, and the socket 57 may be structured as a cap that fits over the shaft 58 of the electrode 52 for contacting the contact region located on the exterior surface 60 of the shaft 58. In another embodiment, as shown in FIGS. 2A, 2B, 3 and 4, the electrode 52 defines a cup 68 for receiving the socket 57. When the electrode 52 defines the cup 68, the contact region 66 is located within a portion of the cup 68. The socket 57 and the cup 68 can be designed such that the socket 57 can be removed from the electrode 52 when the carrier body 24 is harvested from the manufacturing apparatus 20. Typically, the head 64 defines a diameter $D_2$ that is greater than the diameter $D_1$ of the shaft 58. The base plate 36 defines a hole (not numbered) for receiving the shaft 58 of the electrode 52 such that the head 64 of the electrode 52 remains within the chamber 30 for sealing the chamber 30.

A first set of threads 70 can be disposed on the exterior surface 60 of the electrode 52. Referring back to FIG. 1, a dielectric sleeve 72 is typically disposed around the electrode 52 for insulating the electrode 52. The dielectric sleeve 72 can comprise a ceramic. A nut 74 is disposed on the first set of threads 70 for compressing the dielectric sleeve 72 between the base plate 36 and the nut 74 to secure the electrode 52 to the housing 28. It is to be appreciated that the electrode 52 can be secured to the housing 28 by other methods, such as by a flange, without deviating from the scope of the subject invention.

Typically, at least one of the shaft 58 and the head 64 includes an interior surface 76 defining the channel 78. The interior surface 76 includes a terminal end 80 spaced from the first end 61 of the shaft 58. The terminal end 80 is generally flat and parallel to the first end 61 of the electrode 52. It is to be appreciated that other configurations of the terminal end 80 can be utilized such as a cone-shaped configuration, an ellipse-shaped configuration, or an inverted cone-shaped configuration (none of which are shown). The channel 78 has a length L that extends from the first end 61 of the electrode 52 to the terminal end 80. It is to be appreciated that the terminal end 80 can be disposed within the shaft 58 of the electrode 52 or the terminal end 80 can be disposed within the head 64 of the electrode 52, when present, without deviating from the subject invention.

The manufacturing apparatus 20 further includes a power supply device 82 coupled to the electrode 52 for providing an electrical current. Typically, an electric wire or cable 84 couples the power supply device 82 to the electrode 52. In one embodiment, the electric wire 84 is connected to the electrode 52 by disposing the electric wire 84 between the first set of threads 70 and the nut 74. It is to be appreciated that the connection of the electric wire 84 to the electrode 52 can be accomplished by different methods.

The electrode 52 has a temperature, which is modified by passage of the electrical current there through resulting in a heating of the electrode 52 and thereby establishing an operating temperature of the electrode 52. Such heating is known to those skilled in the art as Joule heating. In particular, the electrical current passes through the electrode 52, through the socket 57 and into the carrier body 24 resulting in the Joule heating of the carrier body 24. Additionally, the Joule heating of the carrier body 24 results in a radiant/convective heating of the chamber 30. The passage of electrical current through the carrier body 24 establishes an operating temperature of the carrier body 24.

Figure 5:
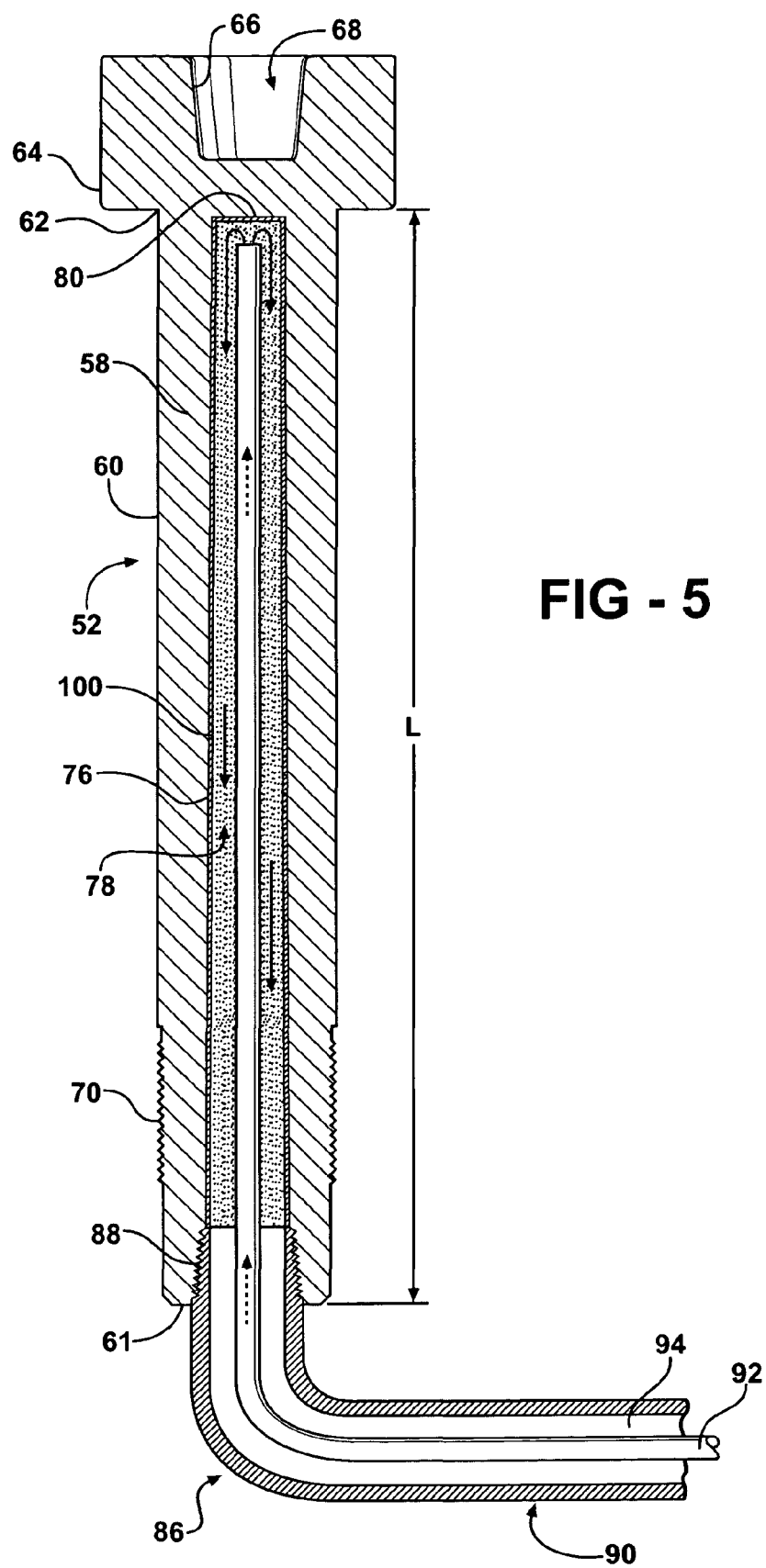
FIG. 5 is a cross-sectional view of the electrode of FIG. 3 with a portion of a circulating system connected thereto.

Referring to FIG. 5 and back to FIGS. 1 and 6, the manufacturing apparatus 20 can also include a circulating system 86 at least partially disposed within the channel 78 of the electrode 52. When present, the circulating system 86 is at least partially disposed within the channel 78. It is to be appreciated that a portion of the circulating system 86 can be disposed outside the channel 78. A second set of threads 88 can be disposed on the interior surface 76 of the electrode 52 for coupling the circulating system 86 to the electrode 52. However, it is to be appreciated by those skilled in the art that other fastening methods, such as the use of flanges or couplings, can be used to couple the circulating system 86 to the electrode 52.

The circulating system 86 includes a coolant in fluid communication with the channel 78 of the electrode 52 for reducing the temperature of the electrode 52. In one embodiment, the coolant is water; however, it is to be appreciated that the coolant can be any fluid designed to reduce heat through circulation without deviating from the subject invention. Moreover, the circulating system 86 also includes a hose 90 coupled between the electrode 52 and a reservoir (not shown). Referring only to FIG. 5, the hose 90 includes an inner tube 92 and an outer tube 94. It is to be appreciated that the inner tube 92 and the outer tube 94 can be integral to the hose 90 or, alternatively, the inner tube 92 and the outer tube 94 can be attached to the hose 90 by utilizing couplings (not shown). The inner tube 92 is disposed within the channel 78 and extends a majority of the length L of the channel 78 for circulating the coolant within the electrode 52.

The coolant within the circulating system 86 is under pressure to force the coolant through the inner tube 92 and the outer tubes 94. Typically, the coolant exits the inner tube 92 and is forced against the terminal end 80 of the interior surface 76 of the electrode 52 and subsequently exits the channel 78 via the outer tube 94 of the hose 90. It is to be appreciated that reversing the flow configuration such that the coolant enters the channel 78 via the outer tube 94 and exits the channel 78 via the inner tube 92 is also possible. It is also to be appreciated by those skilled in the art of heat transfer that the configuration of the terminal end 80 influences the rate of heat transfer due to the surface area and proximity to the head 64 of the electrode 52. As set forth above, the different geometric contours of the terminal end 80 result in different convective heat transfer coefficients for the same circulation flow rate.

Referring to FIGS. 3, 4, and 6, the electrode 52 includes a contact region coating 96 disposed on the contact region 66 of the electrode 52. The contact region coating 96 has an electrical conductivity of at least $9 \times 10^6$ Siemens/meter, more typically at least 20 S/m, most typically at least 40 S/m, and a corrosion resistance higher than silver in a galvanic series based upon room temperature seawater as an electrolyte. Such galvanic series tests are well known in the art. Due to a greater importance of electrical conductivity for the contact region coating 96 than for other portions of the electrode 52 that are not in the primary current path between the electrode 52 and the carrier body 24, and because the contact region coating 96 is in contact with the socket 57 during deposition and is somewhat shielded from the material 22 deposited on the carrier body, specific materials are chosen for use in the contact region coating 96 that satisfy the electrical conductivity properties set forth above. Further, it is advantageous to select a material that has a threshold resistance to corrosion and, thus, fouls at a slower rate than the materials used for the electrode 52 itself. The slower fowling provides advantages relative to increasing the life of the electrode 52.

Selection of the specific type of materials chosen for the contact region coating 96 can depend on the environmental conditions surrounding the electrode and, in particular, thermal conditions in the vicinity of the electrode 52 due to a combination of the temperature of the carrier body 24, electrical current flowing through the electrode 52, cooling fluid flow rate, and cooling fluid temperature.

In the embodiment of the electrode 52 shown in FIGS. 2A, 2B, 3, 4 and 5 that includes the cup 68, the corrosion decreases the tolerance of the cup 68 and results in a poor fit between the socket 57 disposed on the carrier body 24 and the contact region 66 located within a portion of the cup 68 of the electrode 52. The poor fit results in small electrical arcs between the contact region 66 and the socket 57 as the electrical current is conducted from the electrode 52 to the carrier body 24. The small electrical arcs result in the metal of the electrode 52 being deposited on the carrier body 24, thereby resulting in a metal contamination of the material 22 deposited on the carrier body 24. As an example, in the manufacture of high purity silicon it is desirous to keep metallic contaminants at a minimum in the processed carrier body after deposition because the metallic contaminants contribute impurities to silicon ingots and wafers made from the processed carrier body. These metallic contaminants on the wafers can diffuse from the bulk wafer into active regions of micro-electronic devices made with the wafers during post processing of the micro-electronic devices. Copper, for example, is exceptionally prone to diffusion within the wafers if the concentration of copper in the processed carrier body is too high. Generally, the electrode 52 must be replaced once the metal contamination exceeds the threshold level in polycrystalline silicon or once the material 22 is deposited on the electrode 52 and prevents the removal of the socket 57 from the cup 68 of the electrode 52 after processing. To illustrate this situation, copper contamination of polycrystalline silicon due to copper-based electrodes is typically below a threshold of 0.01 ppba. However, it is recognized to those skilled in the art of producing semiconductor materials of high purity that specifications for transition metal contamination differ based upon the particular application. For example, it is known that silicon used in the manufacture of ingots and wafers for photovoltaic cells can tolerate appreciably higher levels of copper contamination relative to semiconductor-grade silicon, e.g 100-10,000 fold, without significant loss in lifetime and cell performance. As such, each purity specification for polycrystalline silicon may be evaluated individually when viewed against the electrode replacement need.

Additionally, the corrosion decreases the efficiency of electrical conductivity between the electrode 52 and the carrier body 24, in particular between the contact region 66 of the electrode 52 and the socket 57. The decrease in the efficiency of electrical conductivity requires an increase in the electrical current required to heat the operating temperature of the carrier body 24 to the deposition temperature. The decrease in efficiency of electrical conductivity also increases the operating temperature of the electrode 52. As the operating temperature of the electrode 52 approaches the deposition temperature, the material 22 deposits on the electrode 52.

The contact region coating 96 extends the life of the electrode by providing a higher resistance to corrosion than the materials that are generally used to form the electrode 52. Further, because corrosion of the electrode 52 at the contact region 66 is one factor that controls whether or not the electrode 52 must be replaced, selection of materials for the contact region coating 96 based on resistance to corrosion can be more effective in extending the life of the electrode 52 than selection of materials for other portions of the electrode where corrosion may be a lesser concern. Therefore, the specific type of material used for the contact surface coating 96 must resist corrosion while maintaining the electrical conductivity of the electrode 52.

Suitable materials that can be used for the contact region coating 96 include gold, platinum, and palladium. Typically, the contact region coating 96 comprises gold due to an excellent combination of electrical conductivity and resistance to corrosion from various sources. The contact region coating 96 may include other metals so long as at least one of gold, platinum, and palladium are included in the contact region coating 96. For example, in one embodiment, the contact region coating 96 may further include at least one of silver, nickel, and chromium, such as a nickel/silver alloy. Typically, the contact region coating 96 includes substantially only gold, platinum, and/or palladium. However, when one or more of the other metals are present, the total amount of gold, platinum, and palladium is typically at least 50% by weight based on the total weight of the contact region coating 96.

The contact region coating 96 has a thickness of from 0.00254 to 0.254 mm, more typically from 0.00508 mm to 0.127 mm and most typically from 0.00508 mm to 0.0254 mm.

Without being bound by theory, the delay of fouling attributed to the presence of the contact region coating 96 extends the life of the electrode 52. More specifically, the contact region coating 96 maintains the electrical conductivity between the electrode 52 and the socket 57, which allows a reduction of the operating temperature of the electrode 52 and prevents the deposition of the material 22 on the electrode 52. Furthermore, the contact region coating 96 provides corrosion resistance for maintaining the connection between the socket 57 and the contact region 66 to prevent contamination of the deposited material 22 with metal from the electrode 52. Increasing the life of the electrode 52 decreases production cost as the electrode 52 needs to be replaced less often as compared to electrodes 52 without the contact region coating 96. Additionally, the production time to deposit the material 22 on the carrier body 24 is also decreased because replacement of electrodes 52 is less frequent compared to when electrodes 52 are used without the contact region coating 96. The contact region coating 96 therefore results in less down time for the manufacturing apparatus 20.

The electrode 52 can be coated in locations other than the contact region 66 for extending the life of the electrode 52. Referring to FIG. 6, in one embodiment the electrode 52 includes an exterior coating 98 disposed on the exterior surface 60 thereof outside of the contact region 66. In particular, the exterior coating 98 can be disposed on at least one of the head 64, outside of the contact region 66, and the shaft 58 of the electrode 52. Stated differently, the exterior coating 98 can be disposed on the head 64 outside of the contact region 66, on the shaft 58, or on both the head 64 outside of the contact region 66 and on the shaft 58.

When included on the shaft 58, the exterior coating 98 can extend from the head 64 to the first set of threads 70 on the shaft 58. The exterior coating 98 has an electrical conductivity of at least $9 \times 10^6$ S/m, more typically at least 20 S/m, most typically at least 40 S/m, and a corrosion resistance higher than silver in a galvanic series based upon room temperature seawater as an electrolyte. Due to a lesser importance of electrical conductivity for the exterior coating 98 than for the electrode 52 itself, and because the exterior coating 98 is not intended to be in contact with the socket 57 during deposition, a wider range of materials can be used for the exterior coating 98 than can be used for portions of the electrode 52 that are intended to be in contact with the carrier body 24. Further, because a wider range of materials satisfy the electrical conductivity requirements for the exterior coating 98 than for the portions of the electrode 52 that are intended to be in contact with the carrier body 24, materials can be chosen that are more resistant to corrosion and, thus, foul at a slower rate than the materials used for the electrode 52 itself The slower fowling provides advantages relative to increasing the life of the electrode 52.

The specific type of material used for the exterior coating 98 can depend upon the specific location of the exterior coating 98. For example, the source of corrosion and, thus, fouling can be different depending upon the specific location of the exterior coating 98. When the exterior coating 98 is disposed on the exterior surface 60 of the head 64 outside of the contact region 66, the exterior coating 98 is disposed within the chamber 78 and, thus, is exposed to the material 22 that is used to deposit on the carrier body 24. Under such circumstances, it can be desirable for the exterior coating 98 to provide resistance to corrosion in a chloride environment during the harvesting of polycrystalline silicon and to further provide resistance to chemical attack via chlorination and/or silicidation as a result of exposure to the material 22 that is used during the deposition process. Suitable metals that can be used for the exterior coating 98 on the head 64 of the electrode 52 outside of the contact region 66 include gold, platinum, and palladium. Other suitable metals that may be used for the exterior coating 98 include silver, nickel, and chromium. When the exterior coating 98 is disposed on the exterior surface 60 of the shaft 58, the exterior coating 98 can include the same or different metals from those included in the exterior coating 98 on the head 64 outside of the contact region 66. In another embodiment, the shaft 58 can be free from a coating disposed on the exterior surface 60 thereof. In yet another embodiment, the exterior surface 60 of the head can be free from a coating, with the exterior coating 98 only disposed on the exterior surface 60 of the shaft 58.

The exterior coating 98 typically has a thickness of from 0.0254 mm to 0.254 mm, more typically from 0.0508 mm to 0.254 mm and most typically from 0.127 mm to 0.254 mm.

In addition, a channel coating 100 can be disposed on the interior surface 76 of the electrode 52 for maintaining the thermal conductivity between the electrode 52 and the coolant. Generally, the channel coating 100 has a higher resistance to corrosion that is caused by the interaction of the coolant with the interior surface 76 as compared to the resistance to corrosion of the electrode 52. The channel coating 100 typically includes a metal that resists corrosion and that inhibits buildup of deposits. For example, the channel coating 100 can comprise at least one of silver, gold, nickel, and chromium. Typically, the channel coating 100 is nickel. The channel coating 100 has a thermal conductivity of from 70.3 to 427 W/m K, more typically from 70.3 to 405 W/m K and most typically from 70.3 to 90.5 W/m K. The channel coating 100 also has a thickness of from 0.0025 mm to 0.026 mm, more typically from 0.0025 mm to 0.0127 mm and most typically from 0.0051 mm to 0.0127 mm.

It is to be appreciated that the electrode 52 can include an anti-tarnishing layer (not shown) disposed on the channel coating 100. The anti-tarnishing layer is a protective thin film organic layer that is applied on top of the channel coating 100. Protective systems such as Technic Inc.'s Tarniban™ can be used following the formation of the channel coating 100 of the electrode 52 to reduce oxidation of the metal in the electrode 52 and in the channel coating 100 without inducing excessive thermal resistance. For example, in one embodiment, the electrode 52 can comprise silver and the channel coating 100 can comprise silver with the anti-tarnishing layer present for providing enhanced resistance to the formation of deposits compared to pure silver. Typically, the electrode 52 comprises copper and the channel coating 100 comprises nickel for maximizing thermal conductivity and resistance to the formation of deposits, with the anti-tarnishing layer disposed on the channel coating 100.

It is to be appreciated that the electrode 52 can have at least one of the exterior coating 98 and the channel coating 100 in any combination in addition to the contact region coating 96. The channel coating 100, the exterior coating 98, and the contact region coating 96 can be formed by electroplating. However, it is to be appreciated that each of the coatings can be formed by different methods without deviating from the subject invention. Also, it is to be appreciated by those skilled in the art of manufacturing high purity semiconductor materials, such as polycrystalline silicon, that some plating processes utilize materials that are dopants, e.g. Group III and Group V elements (excluding nitrogen for the case of manufacturing polycrystalline silicon), and choice of the appropriate coating method can minimize the potential contamination of the carrier body 24. For example, it is desired that areas of the electrode typically disposed within the chamber 32, such as the head coating 108 and the contact region coating 96, have minimal boron and phosphorous incorporation in their respective electrode coatings.

A typical method of deposition of the material 22 on the carrier body 24 is discussed below and refers to FIG. 6. The carrier body 24 is placed within the chamber 30, such that the sockets 57 disposed at the first end 54 and the second end 56 of the carrier body 24 are disposed within the cup 68 of the electrode 52 and the chamber 30 is sealed. The electrical current is transferred from the power supply device 82 to the electrode 52. A deposition temperature is calculated based on the material 22 to be deposited. The operating temperature of the carrier body 24 is increased by direct passage of the electrical current to the carrier body 24 so that the operating temperature of the carrier body 24 exceeds the deposition temperature. The gas 45 is introduced into the chamber 30 once the carrier body 24 reaches the deposition temperature. In one embodiment, the gas 45 introduced into the chamber 30 comprises a halosilane, such as a chlorosilane or a bromosilane. The gas can further comprise hydrogen. However, it is to be appreciated that the instant invention is not limited to the components present in the gas and that the gas can comprise other deposition precursors, especially silicon containing molecular such as silane, silicon tetrachloride, and tribromosilane. In one embodiment, the carrier body 24 is a silicon slim rod and the manufacturing apparatus 20 can be used to deposit silicon thereon. In particular, in this embodiment, the gas typically contains trichlorosilane and silicon is deposited onto the carrier body 24 as a result of the thermal decomposition of trichlorosilane. The coolant is utilized for preventing the operating temperature of the electrode 52 from reaching the deposition temperature to ensure that silicon is not deposited on the electrode 52. The material 22 is deposited evenly onto the carrier body 24 until a desired diameter of material 22 on the carrier body 24 is reached.

Once the carrier body 24 is processed, the electrical current is interrupted so that the electrode 52 and the carrier body 24 stop receiving the electrical current. The gas 45 is exhausted through the outlet 46 of the housing 28 and the carrier body 24 is allowed to cool. Once the operating temperature of the processed carrier body 24 has cooled, the processed carrier body 24 can be removed from the chamber 30. The processed carrier body 24 is then removed and a new carrier body 24 is placed in the manufacturing apparatus 20.

Obviously, many modifications and variations of the present invention are possible in light of the above teachings. The foregoing invention has been described in accordance with the relevant legal standards; thus, the description is exemplary rather than limiting in nature. Variations and modifications to the disclosed embodiment may become apparent to those skilled in the art and do come within the scope of the invention. Accordingly, the scope of legal protection afforded this invention may only be determined by studying the following claims.

What is claimed is:

1. A manufacturing apparatus for deposition of a material on a carrier body having a first end and a second end spaced from each other with a socket disposed at each end of the carrier body, said apparatus comprising:
    a housing defining a chamber;
    an inlet defined through said housing for introducing a gas into the chamber;
    an outlet defined through said housing for exhausting the gas from the chamber;
    at least one electrode including a shaft having a first end and a second end with a head disposed on one of said ends of said shaft for coupling with the socket with said electrode having an exterior surface having a contact region adapted to contact the socket, said electrode disposed through said housing with said electrode at least partially disposed within the chamber for coupling with the socket;
    a power supply device coupled to said electrode for providing an electrical current to said electrode;
    a contact region coating disposed on said contact region of said electrode for maintaining thermal conductivity between said electrode and the socket, said contact region coating having an electrical conductivity of at least $9 \times 10^6$ Siemens/meter and corrosion resistance higher than silver in a galvanic series based upon room temperature sea water as an electrolyte; and
    an exterior coating different from said contact region coating and disposed on at least one of said head and said shaft outside of said contact region.

2. A manufacturing apparatus as set forth in claim 1 wherein said head comprises copper.

3. A manufacturing apparatus as set forth in claim 1 wherein said exterior surface of said electrode including said contact region coating is at least partially disposed within the chamber.

4. A manufacturing apparatus as set forth in claim 1 wherein said contact region coating comprises at least one of gold, platinum, and palladium.

5. A manufacturing apparatus as set forth in claim 4 wherein said contact region coating further comprises at least one of silver, nickel, and chromium.

6. A manufacturing apparatus as set forth in claim 5 wherein said contact region coating has a thickness of from 0.00254 to 0.254 mm.

7. A manufacturing apparatus as set forth in claim 5 wherein said contact region coating has a thickness of from 0.00508 mm to 0.127 mm.

8. A manufacturing apparatus as set forth in claim 5 wherein said contact region coating has a thickness of from 0.00508 mm to 0.0254 mm.

9. A manufacturing apparatus as set forth in claim 5 wherein said contact region coating has a thickness of from 0.00254 to 0.254 mm.

10. A manufacturing apparatus as set forth in claim 1 wherein said at least one electrode includes a first electrode for receiving the socket at the first end of the carrier body and a second electrode for receiving the socket at the second end of the carrier body.

11. An electrode for use with a manufacturing apparatus to deposit a material onto a carrier body having a first end and a second end spaced from each other with a socket disposed at each end of the carrier body, said electrode comprising:
    a shaft having a first end and a second end;
    a head disposed on one of said ends of said shaft for coupling with the socket;
    wherein said head has an exterior surface having a contact region adapted to contact the socket;
    a contact region coating disposed on said contact region of said electrode for maintaining electrical conductivity between said electrode and the socket, said contact region coating having an electrical conductivity of at least $9 \times 10^6$ Siemens/meter and corrosion resistance higher than silver in a galvanic series based upon room temperature sea water as an electrolyte; and
    an exterior coating different from said contact region coating and disposed on at least one of said head and said shaft outside of said contact region.

12. An electrode as set forth in claim 11 wherein said head is integral to said shaft.

13. An electrode as set forth in claim 11 wherein said contact region coating comprises at least one of gold, platinum, and palladium.

14. An electrode as set forth in claim 13 wherein said contact region coating further comprises at least one of silver, nickel, and chromium.

15. An electrode as set forth in claim 13 wherein said contact region coating has a thickness of from 0.00254 to 0.254 mm.

16. An electrode as set forth in claim 13 wherein said contact region coating has a thickness of from 0.00508 mm to 0.127 mm.

17. An electrode as set forth in claim 13 wherein said contact region coating has a thickness of from 0.00508 mm to 0.0254 mm.

18. An electrode as set forth in claim 11 wherein said head comprises copper.

19. An electrode as set forth in claim 11 wherein said shaft of said electrode includes a shaft coating different from said contact region coating and disposed on an exterior surface of said shaft.

20. An electrode as set forth in claim 11 wherein said shaft is free from a shaft coating disposed on an exterior surface thereof.

21. An electrode as set forth in claim 11 wherein said contact region coating has a thickness of from 0.00254 to 0.254 mm.

* * * * *